(12) United States Patent
Hyun et al.

(10) Patent No.: US 9,666,244 B2
(45) Date of Patent: May 30, 2017

(54) DIVIDING A STORAGE PROCEDURE

(71) Applicant: Fusion-io, Inc., Salt Lake City, UT (US)

(72) Inventors: Jea Hyun, South Jordan, UT (US); Josh Perschon, Sandy, UT (US); James Peterson, San Jose, CA (US); Robert Wood, Niwot, CO (US)

( * ) Notice: Subject to any disclaimer, the term of this patent is extended or adjusted under 35 U.S.C. 154(b) by 0 days.

(21) Appl. No.: 14/297,622

(22) Filed: Jun. 5, 2014

(65) Prior Publication Data

US 2015/0248922 A1  Sep. 3, 2015

Related U.S. Application Data

(60) Provisional application No. 61/946,786, filed on Mar. 1, 2014.

(51) Int. Cl.
G11C 7/00 (2006.01)
G11C 16/16 (2006.01)

(52) U.S. Cl.
CPC ............... *G11C 7/00* (2013.01); *G11C 16/16* (2013.01); *G11C 2216/20* (2013.01)

(58) Field of Classification Search
CPC .......................... G11C 16/16; G11C 2216/20
USPC ........................................................ 365/218
See application file for complete search history.

(56) References Cited

U.S. PATENT DOCUMENTS

| | | | |
|---|---|---|---|
| 4,980,861 A | 12/1990 | Herdt et al. | |
| 5,742,787 A | 4/1998 | Talreja | |
| 5,799,200 A | 8/1998 | Brant et al. | |
| 5,805,501 A | 9/1998 | Shiau et al. | |
| 5,867,430 A | 2/1999 | Chen et al. | |
| 6,278,633 B1 | 8/2001 | Wong et al. | |
| 6,336,174 B1 | 1/2002 | Li et al. | |
| 6,404,647 B1 | 6/2002 | Minne | |
| 6,412,080 B1 | 6/2002 | Fleming et al. | |
| 6,515,909 B1 | 2/2003 | Wooldridge | |
| 6,515,928 B2 | 2/2003 | Sato et al. | |
| 6,552,955 B1 | 4/2003 | Miki | |
| 6,587,937 B1 | 7/2003 | Jensen et al. | |
| 6,608,793 B2 | 8/2003 | Park et al. | |
| 6,633,950 B1 | 10/2003 | Brown et al. | |
| 6,633,956 B1 | 10/2003 | Mitani | |

(Continued)

FOREIGN PATENT DOCUMENTS

GB  0123416.0  9/2001
WO  2010053756  5/2010

OTHER PUBLICATIONS

U.S. Appl. No. 13/834,955, Notice of Allowance, Jan. 12, 2015.

(Continued)

*Primary Examiner* — Son Mai
*Assistant Examiner* — Muna A Techane
(74) *Attorney, Agent, or Firm* — Kunzler Law Group, PC

(57) ABSTRACT

Apparatuses, systems, methods, and computer program products are disclosed for storage operations for a non-volatile medium. A control module may be configured to divide a storage procedure into multiple portions. An execution module may be configured to execute multiple portions of a storage procedure independently. A storage request module may be configured to satisfy a storage request for one or more storage elements of a storage procedure between at least a pair of portions of a storage procedure.

18 Claims, 6 Drawing Sheets

(56) References Cited

U.S. PATENT DOCUMENTS

| | | | |
|---|---|---|---|
| 6,643,181 B2 | 11/2003 | Sofer et al. | |
| 6,735,546 B2 | 5/2004 | Scheuerlein | |
| 6,751,155 B2 | 6/2004 | Gorobets | |
| 6,760,806 B2 | 7/2004 | Jeon | |
| 6,845,053 B2 | 1/2005 | Chevallier | |
| 6,849,480 B1 | 2/2005 | Low et al. | |
| 6,871,257 B2 | 3/2005 | Conley et al. | |
| 6,883,044 B1 | 4/2005 | Roohparvar | |
| 6,887,058 B2 | 5/2005 | Fujiwara | |
| 6,920,522 B2 | 7/2005 | Roohparvar | |
| 6,977,847 B2 | 12/2005 | Lasser et al. | |
| 7,042,664 B2 | 5/2006 | Gill et al. | |
| 7,057,936 B2 | 6/2006 | Yaegashi et al. | |
| 7,064,994 B1 | 6/2006 | Wu | |
| 7,080,193 B2 | 7/2006 | Roohparvar | |
| 7,107,480 B1 | 9/2006 | Moshayedi et al. | |
| 7,167,944 B1 | 1/2007 | Estakhri | |
| 7,177,197 B2 | 2/2007 | Cernea | |
| 7,215,580 B2 | 5/2007 | Gorobets | |
| 7,227,777 B2 | 6/2007 | Roohparvar | |
| 7,257,129 B2 | 8/2007 | Lee et al. | |
| 7,263,591 B2 | 8/2007 | Estakhri et al. | |
| 7,340,558 B2 | 3/2008 | Lee et al. | |
| 7,340,581 B2 | 3/2008 | Gorobets et al. | |
| 7,400,537 B2 | 7/2008 | Hemink et al. | |
| 7,403,424 B2 | 7/2008 | Hemink et al. | |
| 7,424,593 B2 | 9/2008 | Estakhri et al. | |
| 7,441,090 B2 | 10/2008 | Estakhri et al. | |
| 7,451,344 B1 | 11/2008 | Rothberg | |
| 7,457,166 B2 | 11/2008 | Hemink et al. | |
| 7,460,432 B2 | 12/2008 | Warner | |
| 7,463,521 B2 | 12/2008 | Li | |
| 7,463,532 B2 | 12/2008 | Tran et al. | |
| 7,480,766 B2 | 1/2009 | Gorobets | |
| 7,495,954 B2 | 2/2009 | Ito | |
| 7,499,317 B2 | 3/2009 | Ito | |
| 7,499,338 B2 | 3/2009 | Ito | |
| 7,522,457 B2 | 4/2009 | Hemink et al. | |
| 7,529,905 B2 | 5/2009 | Sinclair | |
| 7,535,766 B2 | 5/2009 | Ito | |
| 7,630,255 B2 | 12/2009 | Yang | |
| 7,631,138 B2 | 12/2009 | Gonzalez et al. | |
| 7,777,652 B2 | 8/2010 | Lee et al. | |
| 7,856,528 B1 | 12/2010 | Frost et al. | |
| 7,908,501 B2 | 3/2011 | Kim et al. | |
| 7,930,589 B2 | 4/2011 | Lavastre et al. | |
| 7,944,762 B2 | 5/2011 | Gorobets | |
| 8,001,334 B2 | 8/2011 | Lee | |
| 8,055,922 B2 | 11/2011 | Brittain et al. | |
| 8,130,551 B2 | 3/2012 | Oowada et al. | |
| 8,289,801 B2 | 10/2012 | Smith et al. | |
| 8,364,888 B2 | 1/2013 | Melik-Martirosian et al. | |
| 8,429,436 B2 | 4/2013 | Fillingim et al. | |
| 8,972,627 B2 | 3/2015 | Strasser et al. | |
| 9,021,158 B2 | 4/2015 | Hyun et al. | |
| 9,223,514 B2 | 12/2015 | Hyun et al. | |
| 2002/0066047 A1 | 5/2002 | Olarig et al. | |
| 2002/0199056 A1 | 12/2002 | Ayukawa et al. | |
| 2003/0115405 A1 | 6/2003 | Funyu et al. | |
| 2003/0126475 A1 | 7/2003 | Bodas | |
| 2003/0145230 A1 | 7/2003 | Chiu et al. | |
| 2003/0163630 A1 | 8/2003 | Aasheim et al. | |
| 2003/0163663 A1 | 8/2003 | Aasheim et al. | |
| 2003/0210601 A1 | 11/2003 | Lin et al. | |
| 2004/0003002 A1 | 1/2004 | Adelmann | |
| 2004/0003167 A1 | 1/2004 | Kimura et al. | |
| 2004/0057288 A1* | 3/2004 | Kawabata | G11C 16/10 365/185.29 |
| 2004/0064647 A1 | 4/2004 | DeWhitt et al. | |
| 2004/0114431 A1* | 6/2004 | Shona | G11C 16/102 365/185.11 |
| 2004/0148360 A1 | 7/2004 | Mehra et al. | |
| 2004/0177054 A1 | 9/2004 | Stern et al. | |
| 2004/0186946 A1 | 9/2004 | Lee | |
| 2004/0225719 A1 | 11/2004 | Kisley et al. | |
| 2005/0018527 A1 | 1/2005 | Gorobets | |
| 2005/0210323 A1 | 9/2005 | Batchelor et al. | |
| 2005/0246558 A1 | 11/2005 | Ku | |
| 2006/0053247 A1* | 3/2006 | Cheung | G11C 16/16 711/103 |
| 2006/0059326 A1 | 3/2006 | Aasheim et al. | |
| 2006/0106990 A1 | 5/2006 | Benhase et al. | |
| 2006/0149916 A1 | 7/2006 | Nase | |
| 2006/0184736 A1 | 8/2006 | Benhase et al. | |
| 2006/0230295 A1 | 10/2006 | Schumacher et al. | |
| 2006/0265624 A1 | 11/2006 | Moshayedi | |
| 2007/0168698 A1 | 7/2007 | Coulson et al. | |
| 2007/0204270 A1* | 8/2007 | Shin | G06F 3/0611 718/103 |
| 2007/0230253 A1 | 10/2007 | Kim | |
| 2007/0233938 A1 | 10/2007 | Cho et al. | |
| 2007/0234021 A1 | 10/2007 | Ruberg et al. | |
| 2007/0239926 A1 | 10/2007 | Gyl et al. | |
| 2007/0245094 A1 | 10/2007 | Lee et al. | |
| 2007/0274150 A1 | 11/2007 | Gorobets | |
| 2008/0037330 A1* | 2/2008 | Park | G11C 16/16 365/185.22 |
| 2008/0052483 A1 | 2/2008 | Rangarajan et al. | |
| 2008/0059820 A1 | 3/2008 | Vaden et al. | |
| 2008/0080243 A1 | 4/2008 | Edahiro et al. | |
| 2008/0104344 A1 | 5/2008 | Shimozono et al. | |
| 2008/0117686 A1 | 5/2008 | Yamada | |
| 2008/0126686 A1 | 5/2008 | Sokolov et al. | |
| 2008/0266973 A1 | 10/2008 | Sekar et al. | |
| 2008/0282031 A1 | 11/2008 | Tanoue | |
| 2008/0301475 A1 | 12/2008 | Felter et al. | |
| 2008/0320323 A1 | 12/2008 | Brittain et al. | |
| 2009/0037778 A1 | 2/2009 | Resnick | |
| 2009/0091979 A1 | 4/2009 | Shalvi | |
| 2009/0091996 A1 | 4/2009 | Chen et al. | |
| 2009/0150621 A1 | 6/2009 | Lee | |
| 2009/0157989 A1 | 6/2009 | Karamcheti et al. | |
| 2009/0193183 A1 | 7/2009 | Kudo et al. | |
| 2009/0239468 A1 | 9/2009 | He et al. | |
| 2010/0049913 A1 | 2/2010 | Marcu et al. | |
| 2010/0067306 A1 | 3/2010 | Hwang | |
| 2010/0102999 A1 | 4/2010 | Lee et al. | |
| 2010/0106917 A1 | 4/2010 | Ruberg et al. | |
| 2010/0110798 A1* | 5/2010 | Hoei | G11C 5/063 365/185.24 |
| 2010/0153680 A1 | 6/2010 | Baum et al. | |
| 2010/0257304 A1 | 10/2010 | Rajan et al. | |
| 2010/0262738 A1 | 10/2010 | Swing et al. | |
| 2010/0262740 A1 | 10/2010 | Borchers et al. | |
| 2010/0262757 A1 | 10/2010 | Sprinkle et al. | |
| 2010/0262758 A1 | 10/2010 | Swing et al. | |
| 2010/0262759 A1 | 10/2010 | Borchers et al. | |
| 2010/0262760 A1 | 10/2010 | Swing et al. | |
| 2010/0262761 A1 | 10/2010 | Borchers et al. | |
| 2010/0262762 A1 | 10/2010 | Borchers et al. | |
| 2010/0262766 A1 | 10/2010 | Sprinkle et al. | |
| 2010/0262767 A1 | 10/2010 | Borchers et al. | |
| 2010/0262773 A1 | 10/2010 | Borchers et al. | |
| 2010/0262894 A1 | 10/2010 | Swing et al. | |
| 2010/0262979 A1 | 10/2010 | Borchers et al. | |
| 2010/0268974 A1 | 10/2010 | Floyd et al. | |
| 2010/0287217 A1 | 11/2010 | Borchers et al. | |
| 2010/0332871 A1 | 12/2010 | Allalouf et al. | |
| 2011/0157992 A1* | 6/2011 | Strasser | G06F 1/183 365/185.18 |
| 2011/0208911 A1 | 8/2011 | Taguchi et al. | |
| 2012/0239868 A1 | 9/2012 | Ryan | |
| 2012/0254515 A1 | 10/2012 | Melik-Martirosian et al. | |
| 2013/0318285 A1 | 11/2013 | Pignatelli | |
| 2014/0003156 A1 | 1/2014 | He | |
| 2014/0215175 A1 | 7/2014 | Kasorla et al. | |
| 2015/0248922 A1 | 9/2015 | Hyun et al. | |
| 2016/0210050 A1 | 7/2016 | Hyun et al. | |

OTHER PUBLICATIONS

Shibata, Noboru, "19nm 112.8mm2 64Gb Multi-level Flash Memory with 400Mb/s/pin 1.8V Toggle Mode Interface", Flash

(56) References Cited

OTHER PUBLICATIONS

Memory Summit, 2012, pp. 21 and 23, Santa Clara, California.
U.S. Appl. No. 13/800,628, Final Office Action, May 5, 2015.
Application No. PCT/US2015/017804, International Search Report and Written Opinion, May 26, 2015.
Application No. 10816108.4, Office Action, Sep. 30, 2015.
U.S. Appl. No. 13/800,628, Office Action, Dec. 5, 2014.
"Am29DL322D/323D/324D", Spansion, Oct. 7, 2004, pp. 57, Publication No. 21534, Revision D, Amendment +7.
Application No. PCT/US2012/024927, 2380.2.62PCT, International Search Report and Written Opinion, Oct. 12, 2012.
Leventhal, Adam, "Flash Storage Memory", Communications of the ACM, Jul. 2008, pp. 5, vol. 61, No. 7.
U.S. Appl. No. 13/372,430, Notice of Allowance, Nov. 3, 2014.
PCT/US2015/017804, International Search Report, May 26, 2015.
Agrawal et al., "ECC and Signal Processing Technology for Solid State Drives and Multi-bit per cell NAND Flash Memories" Forward Insights, Report No. FI-NFL-FSP-0110, (Jan. 2010), 174 pages.
PCT/US2010/048321, International Search Report, Apr. 28, 2011.
PCT/US2010/048320, International Search Report, Apr. 28, 2011.
U.S. Appl. No. 13/800,628, Notice of Allowance, Aug. 18, 2015.
U.S. Appl. No. 13/800,628, Office Action, Apr. 2, 2014.
Application No. PCT/US2012/024927, International Preliminary Report on Patentability, Aug. 13, 2013.
U.S. Appl. No. 13/834,955, Office Action, Apr. 4, 2014.
U.S. Appl. No. 13/834,955, Final Office Action, Sep. 8, 2014.
U.S. Appl. No. 13/372,430, Office Action, Nov. 7, 2013.
U.S. Appl. No. 13/372,430, Final Office Action, Apr. 21, 2014.
U.S. Appl. No. 12/878,987, Office Action, Oct. 18, 2012.
U.S. Appl. No. 12/878,987, Notice of Allowance, Mar. 21, 2013.
PCT/US2010/048321, International Preliminary Report on Patentability, Mar. 22, 2012.
U.S. Appl. No. 13/800,628, Final Office Action, Aug. 7, 2014.
PCT/US2010/048320, International Preliminary Report on Patentability, Mar. 22, 2012.
PCT/US2015/017804 International Preliminary Report on Patentability dated Sep. 15, 2016.
U.S. Appl. No. 14/656,345 Non-Final Rejection mailed Jun. 30, 2016.

\* cited by examiner

DIVIDING A STORAGE PROCEDURE

CROSS-REFERENCES TO RELATED APPLICATIONS

This application claims the benefit of U.S. Provisional Patent Application No. 61/946,786 entitled "DIVIDING A STORAGE PROCEDURE" and filed on Mar. 1, 2014 for Jea Hyun, et al., which is incorporated herein by reference.

FIELD

This disclosure relates to dividing or breaking up a storage procedure for a non-volatile recording medium and more particularly to dividing or breaking up an erase and/or program procedure so that another storage operation may execute.

BACKGROUND

Certain types of storage or memory operations may take longer to execute than others. For example, erase or write/program operations may take longer than a read operation. A longer type of operation may block other operations from executing, increasing a latency for a storage device, or the like.

Further, certain storage operations may be executed as management operations, such as an erase operation or program operation executed for garbage collection, or the like. Not only may management operations block execution of other operations, since a management operation typically isn't in response to a user request, execution of the management operation may not increase the input/output operations per second (IOPS) for a storage device, but may instead decrease IOPS by blocking other storage operations.

SUMMARY

Methods are presented for a storage procedure. In one embodiment, a method includes adjusting one or more parameters for an erase operation for a set of non-volatile memory cells of a non-volatile memory element so that the erase operation has a predetermined duration. A method, in a further embodiment, may include executing an adjusted erase operation for a set of memory cells for a predetermined duration. In certain embodiments, a method includes iteratively executing one or more additional adjusted erase operations for a set of memory cells with predetermined durations until one of the additional adjusted erase operations is verified as successful.

Apparatuses are presented for a storage procedure. In one embodiment, a control module is configured to divide a storage procedure into multiple segments without executing a suspend command for the storage procedure. An execution module, in certain embodiments, is configured to execute multiple segments of a storage procedure independently.

In one embodiment, an apparatus includes means for independently executing multiple portions of an erase procedure for an erase block of a non-volatile storage element. The multiple portions, in certain embodiments, each include a maximum erase voltage that is less than a default maximum erase voltage for the erase procedure. An apparatus, in a further embodiment, includes means for performing one or more of a read operation and a write operation on a storage element between portions of an erase procedure.

Computer program products are disclosed for a storage procedure. In one embodiment, a computer program product includes a computer readable storage medium storing computer usable program code executable to perform operations. In one embodiment, an operation includes setting a loop count for an erase operation for a memory element to less than a default loop count for a non-volatile memory device comprising the memory element. An operation, in certain embodiments, includes repeating an erase operation with a loop count less than a default loop count until a repeated erase operation completes without failure. In a further embodiment, an operation includes performing one or more storage operations for a memory element between repeating an erase operation.

Reference throughout this specification to features, advantages, or similar language does not imply that all of the features and advantages that may be realized with the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

These features and advantages of the present disclosure will become more fully apparent from the following description and appended claims, or may be learned by the practice of the disclosure as set forth hereinafter.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which.

DETAILED DESCRIPTION

Figure 1:
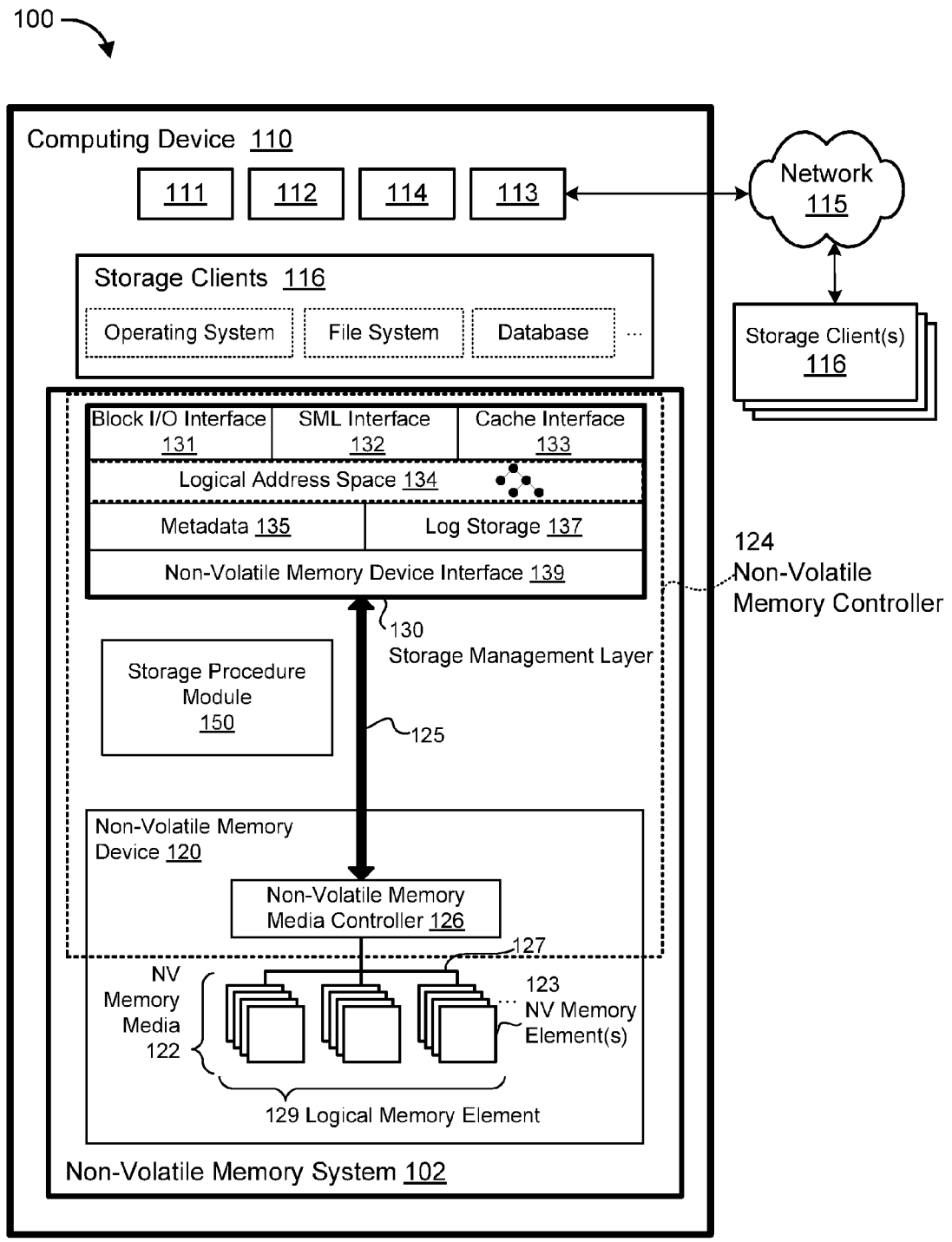
FIG. 1 is a schematic block diagram of one embodiment of a non-volatile memory system comprising a storage procedure module.

Aspects of the present disclosure may be embodied as a system, method or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, or the like, to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: logical or physical pages, memory divisions, logical or physical erase blocks, sectors, blocks, error-correcting code (ECC) code words or chunks, collections or sets of physical storage locations (e.g., logical pages, logical erase blocks, described below), even pages or word lines, odd pages or wordlines, or the like.

The non-volatile memory controller may comprise a storage management layer ("SML"), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address ("LBA"), cylinder/head/sector ("CHS") address, a file name, an object identifier, an inode, a Universally Unique Identifier ("UUID"), a Globally Unique Identifier ("GUID"), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses.

As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller may comprise one or more processes that operate outside of the regular path for servicing of storage operations (e.g., the "path" for performing a storage operation and/or servicing a storage request). As used herein, the "path for servicing a storage request" or "path for servicing a storage operation" (e.g., also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed.

The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1 is a block diagram of one embodiment of a system 100 comprising a storage procedure module 150. The storage procedure module 150 may be part of and/or in communication with a storage management layer (SML) 130, a non-volatile memory media controller 126, or the like. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as a Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., large, virtual address space) through the SML interface 132. The metadata 135 may be used to manage and/or track storage operations performed through any of the Block I/O interface 131, SML interface 132, cache interface 133, or other, related interfaces).

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on one or more of the one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, a network, Infiniband, SCSI RDMA, or the like. The non-volatile memory device interface 139 may communicate with the one or more non-volatile memory devices 120 using input-output control ("IO-CTL") command(s), IO-CTL command extension(s), remote direct memory access, or the like.

The non-volatile memory system 102, in the depicted embodiment, includes a storage procedure module 150. The storage procedure module 150, in certain embodiments, instead of executing a single, default storage operation (e.g., an erase operation, a write/program operation, or the like) may be configured to breakup or divide a storage operation into a storage procedure comprising multiple operations, segments, and/or portions, which may be independently executable (e.g., individual erase operations, program operations, or the like). The storage procedure module 150, in a further embodiment, may allow one or more other storage operations (e.g., read, write/program, and/or erase operations) to execute on a non-volatile memory element 123 between executing different operations, segments, and/or portions (e.g., at least two/a pair) of a broken up or divided storage procedure.

By breaking up or dividing a storage procedure into multiple divisions, segments, and/or portions, instead of executing a single default operation for the procedure, the storage procedure module 150, in one embodiment, may decrease a latency for other, co-pending storage operations, may reduce stress or wear on the non-volatile memory media 122 when compared to a default storage operation, or the like. In certain embodiments, the storage procedure module 150 may breakup or divide a storage operation or procedure without using a suspend command, a resume command, a restart command, or the like of the non-volatile memory elements 123, which may otherwise add latency instead of decreasing latency for the non-volatile memory element 123.

In certain embodiments, as the non-volatile memory media controller 124 causes the non-volatile memory media 122 to be programmed and erased by applying various program and erase voltages to floating gates of the storage cells, electron charges may become trapped in a tunnel oxide layer of the storage cells, and may build up over time. Depending on a configuration of the program and/or erase procedures used, the amount of trapped electrons may vary.

In certain embodiments, the storage procedure module 150 may reduce, minimize, and/or remove trapped electrons, while still providing the performance benefits of shorter erase and/or program operations, by breaking up and/or dividing an operation into a procedure comprising multiple independent operations. For example, in one embodiment, the storage procedure module 150 may execute or perform several erase and/or program operations for a single erase and/or program procedure, with lower durations and/or voltages than a single, default erase and/or program operation.

As described in greater detail below, the storage procedure module 150 may breakup or divide an erase and/or program procedure into multiple segments, portions, and/or operations which, in certain embodiments, may execute using fewer pulses (e.g., a lower loop count), a different verify voltage, a different initial voltage, a different differential voltage between pulse steps, a different pulse duration, or the like than a default operation.

In one embodiment, the storage procedure module 150 may comprise executable software code, such as a device driver, SML 130, or the like, stored on the computer readable storage media 114 for execution on the processor 111. In another embodiment the storage procedure module 150 may comprise logic hardware of one or more of the non-volatile memory devices 120, such as a non-volatile memory media controller 126, a non-volatile memory controller 124, a device controller, a field-programmable gate array ("FPGA") or other programmable logic, firmware for an FPGA or other programmable logic, microcode for execution on a microcontroller, an application-specific integrated circuit ("ASIC"), or the like. In a further embodiment, the storage procedure module 150 may include a combination of both executable software code and logic hardware.

In one embodiment, the storage procedure module 150 is configured to receive storage requests from the SML 130 via a bus 125 or the like. The storage procedure module 150 may be further configured to transfer data to/from the SML 130 and/or storage clients 116 via the bus 125. Accordingly, the storage procedure module 150, in some embodiments, may comprise and/or be in communication with one or more direct memory access ("DMA") modules, remote DMA modules, bus controllers, bridges, buffers, and so on to facilitate the transfer of storage requests and associated data. In another embodiment, the storage procedure module 150 may receive storage requests as an application programming interface (API) call from a storage client 116, as an IO-CTL command, or the like. The storage procedure module 150 is described in greater detail below with regard to FIG. 2.

As described above, the storage procedure module 150 may be part of and/or in communication with a storage management layer 130. The SML 130 may operate on a non-volatile memory system 102 of a computing device 110, which, as discussed above, may comprise a processor 111, volatile memory 112, communication interface 113, and non-transitory, computer readable storage media 114. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory ("nano RAM or NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM or PCM"), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

The storage controller 124 manages solid-state storage media 122. The storage controller 124 may include various hardware and software controllers, drivers, and software. Certain storage devices, while appearing to a storage client 116 to be a block storage device, do not directly associate particular logical block addresses with particular physical blocks, also referred to in the art as sectors. Such storage devices may use a logical-to-physical translation layer 134. The logical-to-physical translation layer 134 provides a level of abstraction between the logical block addresses used by the storage client 116, and the physical block addresses at which the storage controller 124 stores the data. The logical-to-physical translation layer 134 maps logical block addresses to physical block addresses of data stored on solid-state storage media 122. This mapping allows data to be referenced in a logical address space using logical identifiers, such as a logical block address. A logical identifier does not indicate the physical location of data on the solid-state storage media 122, but is an abstract reference to the data.

The storage controller 124 manages the physical block addresses in the physical address space. In one example, contiguous logical block addresses may in fact be stored in non-contiguous physical block addresses as the logical-to-physical translation layer 134 determines the location on the solid-state storage media 122 to perform data operations.

Furthermore, in one embodiment, the logical address space is substantially larger than the physical address space. This "thinly provisioned" or "sparse address space" embodiment, allows the number of logical identifiers for data references to greatly exceed the number of possible physical addresses. Specifically, the logical address space may be "sparse" and, as such, may comprise a logical capacity that exceeds the physical storage capacity of the solid-state storage media 122. Accordingly, the logical address space may be defined independent of the solid-state storage media 122; the logical address space may present a larger address space than the physical storage capacity of the solid-state storage media 122, may present different storage location partitions and/or block sizes than provided by the solid-state storage media 122, and so on.

The storage controller 124 may support a sparse address space by writing data using a log-based writing structure. Specifically, the storage controller 124, in one embodiment, writes data of a write request to physical storage media of the solid-state storage media 122 at one or more logical addresses of the physical storage media corresponding to the addresses of the write request as mapped by the logical-to-physical translation layer 134. In a further embodiment, the storage controller 124 writes the data of the write request by appending the data to a sequential, log-based writing structure of the physical storage media of the solid-state storage media 122 at an append point. The storage controller 124, in one embodiment, returns one or more physical addresses corresponding to the append point and the logical-to-physical translation layer 134 maps the one or more logical addresses to the one or more physical addresses corresponding to the append point.

As the storage controller 124 clears, trims, replaces, expires, and/or evicts, data from the physical addresses and associated physical storage media, the solid state storage media 122 in the depicted embodiment, are freed to store data for other logical addresses. In one embodiment, the storage controller 124 stores data at the physical addresses using a log-based writing structure such that data overwritten by a subsequent write request invalidates other data in the log. Consequently, a garbage collection process recovers the physical capacity of the invalid data in the log. One embodiment of the log-based, writing structure is a logically ring-like data structure, as new data is appended to the log-based writing structure, previously used physical capacity is reused in a circular, theoretically infinite manner.

As stated above, in conventional block storage devices, a logical block address maps directly to a particular physical block. When a storage client 116 communicating with the conventional block storage device deletes data for a particular logical block address, the storage client 116 may note that the particular logical block address is deleted and can re-use the physical block associated with that deleted logical block address without the need to perform any other action.

Some non-volatile memory devices 120 may be configured to receive messages or commands notifying the non-volatile memory device 120 of these unused logical blocks so that the non-volatile memory device 120 may deallocate the corresponding physical blocks. As used herein, to deallocate a physical block includes marking the physical block as invalid, unused, or otherwise designating the physical block as available for storage capacity recovery, its contents on non-volatile memory media 122 no longer needing to be preserved by the non-volatile memory controller 124. Data block usage information, in reference to the non-volatile memory controller 124, may also refer to information maintained by the non-volatile memory controller 124 regarding which physical blocks are allocated and/or deallocated/unallocated and changes in the allocation of physical blocks and/or logical-to-physical block mapping information. Data block usage information, in reference to the non-volatile memory controller 124, may also refer to information maintained by the non-volatile memory controller 124 regarding which blocks are in use and which blocks are not in use by a storage client 116. Use of a block may include storing of data in the block on behalf of the client, reserving the block for use by a client 116, or the like.

While physical blocks may be deallocated, in certain embodiments, the non-volatile memory controller 124 may not immediately erase the data on the non-volatile memory media 122. The storage procedure module 150 may perform an erase operation or procedure later in time, lazily, opportunistically, or the like. In certain embodiments, the data in a deallocated physical block may be marked as unavailable and/or invalid by the non-volatile memory controller 124 such that subsequent requests for data in the physical block return a null result or an empty set of data.

One example of a command or message for such deallocation is a "Trim" function or command identifying logical blocks to deallocate. A non-volatile memory device 120, upon receiving a Trim command, may deallocate physical blocks for logical blocks whose data is no longer needed by the storage client 116. A non-volatile memory controller 124 that deallocates physical blocks may achieve better performance and increased storage capacity, especially non-volatile memory controllers 124 that write data using certain processes and/or use a similar data storage recovery process.

In one embodiment, the storage procedure module 150 recovers storage capacity of physical non-volatile memory media 122 corresponding to data that is marked as invalid, such as data invalidated by a subsequent write request for one or more logical addresses of the data, or the like. The storage procedure module 150, in certain embodiments, recovers storage capacity of physical non-volatile memory media 122 corresponding to invalid data opportunistically. For example, the storage procedure module 150 may recover storage capacity in response to a storage capacity recovery event, such as a lack of available storage capacity, a percentage of data marked as invalid reaching a predefined threshold level, a consolidation of valid data, an error detection rate for a storage region of physical non-volatile memory media 122 reaching a threshold value, performance crossing a threshold value, a scheduled garbage collection cycle, identifying a storage region of the physical non-volatile memory media 122 with a high amount of invalid data, identifying a storage region of the physical non-volatile memory media 122 with a low amount of wear, or the like.

In one embodiment, the storage procedure module 150 relocates valid data that is in a storage region (e.g., a logical or physical erase block) of the physical non-volatile memory media 122 in the non-volatile memory device 120 that the storage procedure module 150 is recovering to preserve the valid data. For example, the storage procedure module 150 may copy or move valid data from an erase block or other storage region selected for storage capacity recovery forward to an append point of a sequential log-based writing structure, to a new storage region, or the like, performing one or more program operations or procedures for the data on the new storage region (e.g., erase block). Erasing data without relocating the data evicts, removes, deletes, erases, or otherwise clears the data from the non-volatile memory device 120.

In one embodiment, the storage procedure module 150 comprises an autonomous garbage collector system that operates within the non-volatile memory device 120. This allows the non-volatile memory device 120 to manage data to provide wear leveling so that data is systematically spread throughout the solid-state non-volatile memory media 122, or other physical storage media, to improve performance, data reliability, to avoid overuse and underuse of any one location or area of the solid-state non-volatile memory media 122, to lengthen the useful life of the solid-state non-volatile memory media 122, or the like.

The storage procedure module 150, upon recovering a storage region of the physical non-volatile memory media 122, allows the non-volatile memory device 120 to re-use the storage region of the physical non-volatile memory media 122 to store different data. In one embodiment, the storage procedure module 150 adds the recovered storage region of physical non-volatile memory media 122 to an available storage pool for the non-volatile memory device 120, or the like. The storage procedure module 150, in one embodiment, erases existing data in a recovered storage region, and may breakup or divide an erase operation or procedure as described in greater detail below.

In one embodiment, the storage procedure module 150 recovers storage capacity of the non-volatile memory device 120 one or more storage regions at a time. A storage region, in one embodiment, includes a logical or physical erase block or other predefined division. For flash memory, an erase operation on an erase block may write or program ones to every bit in the erase block. Allowing the storage procedure module 150 to operate autonomously and opportunistically within the non-volatile memory device 120 may provide a way to separate erase operations from reads, writes, and other faster operations so that the non-volatile memory device 120 operates efficiently.

Figure 2:
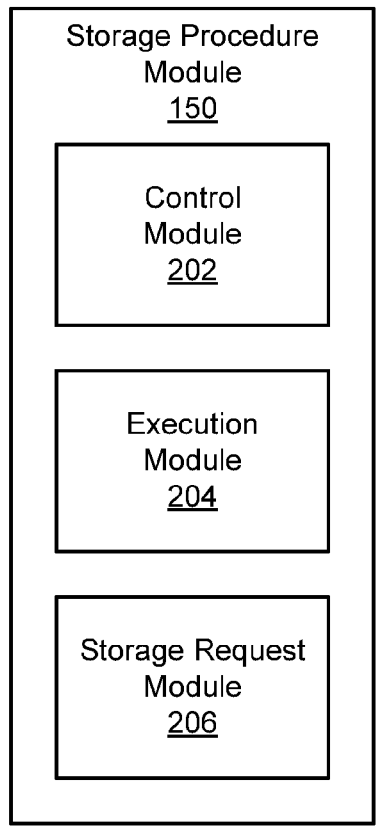
FIG. 2 is a schematic block diagram illustrating one embodiment of a storage procedure module.

FIG. 2 depicts one embodiment of a storage procedure module 150. In the depicted embodiment, the storage procedure module 150 includes a control module 202, an execution module 204, and a storage request module 206.

In one embodiment, the control module 202 is configured to breakup, divide, split, or otherwise separate a storage operation or procedure, such as an erase or program, so that another, pending storage operation may execute, on the same non-volatile memory element 123 (e.g., die, die-plane, chip, package, bank, array, channel, integrated circuit). Rather than use a suspend, resume, and/or restart command of the non-volatile memory element 123 (e.g., provided by a manufacturer, vendor, or the like), the control module 202 may provide natural breaks between operations or a procedure, by adjusting one or more parameters for the operations. For example, the control module 202 may cooperate with the adjustment module 302 described below to iteratively adjust parameters for a plurality of operations (e.g., a series of erase operations, program operations, or the like) for a storage procedure (e.g., an erase procedure, a program procedure) until one of the operations is verified as successful, does not fail, or the like.

As used herein, a storage procedure (e.g., an erase procedure, a program/write procedure, a read procedure), may comprise one or more sub-operations, segments, and/or portions which together satisfy a predetermined goal and/or result (e.g., erasing data from storage cells, programming data to storage cells, reading data from storage cells, or the like). By default, in certain embodiments, a storage procedure may be completed with a single default storage operation, defined with settings or parameters from a manufacturer and/or vendor of the non-volatile memory media 122. From the perspective of the computing device 110, a storage client 116, the SML 130, the non-volatile memory media controller 126, and/or the non-volatile memory controller 124, a storage procedure may be implemented or completed by the control module 202 using a plurality of commands and/or sub-operations, which may comprise separate, independent operations from the perspective of the non-volatile memory media 122 or from a non-volatile memory element 123, even if a default for the non-volatile memory media is to perform the procedure using a single operation (e.g., a single erase command, a single program command, or the like).

For example, a storage client may send a write request to store data in the non-volatile memory device 120 or a trim request to erase data from the non-volatile memory device 120, the non-volatile memory controller 124 may select one or more erase blocks of the non-volatile memory media 122 to erase for garbage collection as part of a storage capacity recovery operation, or the like. A default program procedure for the non-volatile memory media 122 may include a single program operation executed using a single program command (e.g., including address information, data of the write request, or the like) for a respective memory element 123 (and/or for several memory elements 123 in an array) associated with the request, which may cause the non-volatile memory element(s) 123 to perform a program operation comprising a plurality of electrical pulses of varying voltage levels until the single program operation either succeeds or fails. Similarly, a default erase procedure for an erase block of the non-volatile memory media 122 may, by default, include a single erase operation executed using a single erase command (e.g., including an address of an erase block or the like) for a respective memory element 123 to be erased (and/or for several memory elements 123 in an array), which may cause the non-volatile memory element(s) 123 to perform an erase operation comprising a plurality of electrical pulses of varying voltage levels until the single erase operation either succeeds or fails.

A default erase and/or program operation may include N number of pulses (e.g., a maximum loop count of 16 or the like). A vendor and/or manufacturer of the non-volatile memory media 122, in certain embodiments, may set the loop count N high, to ensure that an operation successfully completes, even though longer operations may block other operations, thereby increasing latency for the other operations. For a default operation, each iteration of applying an increased voltage to erase or program cells may be referred to as a loop (e.g., an erase loop, a program loop, or the like). On each iteration, the erase block, page, or other set of storage cells receives an electric pulse with a predefined voltage. For an erase operation, each pulse may be configured to push electrons out of the floating gate while a pulse of a program operation may push electrons into the floating gate, or the like. Each iteration or pulse may be applied for a fixed time period or predetermined duration (e.g., 600-700 microseconds or the like). The voltage applied during an operation may be configured to gradually increase (e.g., ramp up) during the first pulse of an operation. A ramp up voltage may be performed to mitigate the damage on oxide by slowly applying the higher voltages to the cells, or the like. High voltages may cause damage to the oxide layers that separate the floating gate from the other layers.

The control module 202 may modify or adjust a default program and/or erase operation or procedure (e.g., using one or more adjustments from the adjustment module 302 described below), into one or more modified operations that are each shorter than the default operation. The non-volatile memory element 123, in certain embodiments, may detect that the modified operation has completed (e.g., from the perspective of the non-volatile memory element 123, the modified operation may comprise an independently executable command and the non-volatile memory element 123 may be unaware that the modified operation is a sub-operation of a larger storage procedure), before the associated procedure has successfully completed (e.g., before storage cells of the non-volatile memory element 123 have been placed in an erased state, a programmed state, or the like), so that one or more other storage operations may execute during the associated procedure.

For example, to divide or breakup an erase or program procedure into multiple operations, portions, and/or segments, the control module 202 may reduce a loop count (e.g., a maximum number of pulses for a program and/or erase operation) from a default value to shorten the operations and the execution module 204 may repeat the shortened operation as part of a larger storage procedure, with the storage request module 206 executing other storage operations between the shortened operations (e.g., between at least a pair of shortened operations) until the larger procedure is verified as having succeeded, until a retry count for the larger procedure has been satisfied, or the like. Because, in one embodiment, the control module 202 breaks up a storage procedure into multiple operations, segments, and/or portions, with the storage request module 206 executing other storage operations between them, the control module 202 may maintain metadata indicating a state of one or more pending storage procedures, such as a number of sub-operations, segments, and/or portions that have been executed and/or that may remain for a procedure; one or more settings and/or parameters for a sub-operation, segment, and/or portion of a procedure; a result (e.g., failure, success) for a sub-operation, segment, and/or portion of a procedure; or the like.

In certain embodiments, a manufacturer, vendor, or the like may set a default loop count or number of pulses for an erase operation and/or a program operation (e.g., 16 pulses) and the control module 202 may breakup or divide the operation into a procedure comprising multiple operations by setting the loop count to a lower number (e.g., 1 pulse, 2 pulses, 5 pulses, 10 pulses, 15 pulses, or the like). In response to performing a modified operation (e.g., a sub-operation, portion, and/or segment of a procedure), the non-volatile memory element 123, the non-volatile memory device 120, or the like may determine whether a verify voltage (e.g., a program verify voltage, an erase verify voltage) has been satisfied and reports success or failure (e.g., if at least a predefined number or ratio of storage cells satisfy the verify voltage or the like).

In one embodiment, the control module 202 divides a standard or default erase or program procedure (e.g., a default single operation) up into multiple operations, segments, portions, or iterations that are configured to execute or complete in a known, fixed time (e.g., T-erase) or other predetermined duration that may be shorter than a default time or duration (e.g., T-erase) for the default procedure (e.g., a single operation). A time for a procedure (e.g., a single, default operation) with default parameters (e.g., T-erase) may be unpredictable, undefined, and/or nondeterministic, especially as the device 120 ages, and may vary depending on the number of pulses performed before the procedure is verified as successful (e.g., until an erase operation clears the floating gates to put the cells into an erased state). In this manner, the control module 202 may divide a storage procedure into multiple operations, segments, and/or portions, so that each operation, segment, and/or portion has a predetermined, known, predictable, and/or deterministic duration, while the storage procedure may have an undefined duration (e.g., an undetermined or unknown number of sub-operations, segments, and/or portions).

In embodiments where a segment, portion, operation, or division of a storage procedure has a predetermined, deterministic, fixed, configurable, and/or known length or duration a latency for other storage operations may also be known, controlled, and/or predicted based on the predetermined length or duration. Further, because, in one embodiment, the control module 202 breaks or divides an erase or program procedure into separate, independently executable operations, the separate operations may each have a ramp up voltage, which may otherwise occur once for a single-operation procedure. Repeating a ramp up voltage for multiple operations, portions, and/or segments, in certain embodiments, may cause less wear on and/or increase a usable lifetime of a non-volatile storage element 123 when compared to a default operation or procedure. A repeated ramp up voltage may cause less wear due to a gradually increasing voltage being applied with each iteration, instead of a default instantaneous voltage for each pulse after an initial pulse, or the like.

In one embodiment, because the control module 202 may configure a segment, portion, or operation for a storage procedure to have fewer pulses, a lower maximum voltage, or the like than a default procedure or operation (e.g., a default erase operation, a default program operation, or the like), the repeated segments, portions, and/or operations that make up a procedure may have a maximum voltage (e.g., a maximum erase voltage, a maximum program voltage) that is less than a default maximum voltage for the procedure. For example, a default erase operation and/or program operation may comprise multiple pulses (e.g., up to 16 or more), each with successively increasing voltages. However, the control module 202 may reduce the number of pulses (e.g., loop count) from a default and/or may explicitly adjust a maximum voltage setting, so that the segments, portions, or operations the control module 202 provides have a maximum voltage that is less than a default maximum voltage. In certain embodiments, a lower maximum voltage may cause less wear on and/or increase a usable lifetime of a non-volatile storage element 123 when compared to a default storage operation with a higher, default maximum voltage.

As used herein, an operation, segment, portion, or division of a procedure may be independently executable if it may be executed without relying or depending on a different operation, segment, portion, or division. For example, each operation, segment, portion, or division of a procedure may be executed in response to a separate storage operation command (e.g., a separate erase command, a separate program command, or the like), instead of simply suspending and resuming a single operation. Using a suspend command, a resume command, and/or a restart command (e.g., instead of independently executable segments, portions, divisions, or operations) for an erase and/or program operation may not provide a fixed time or length for the operation (e.g., T-erase), may not provide segments or portions with a time or length less than a default time, or the like. The control module 202, in one embodiment, may breakup or divide a procedure without executing a suspend command, a resume command, and/or a restart command for the procedure, by reducing a loop count or number of pulses for an operation of the procedure and repeating the operation or the like.

In certain embodiments, the control module 202 may set a parameter for an operation (e.g., an erase parameter, a program parameter) of a storage procedure to divide or breakup the storage procedure. For example, the control module 202 may write a setting or parameter to a register of a non-volatile memory element 123, provide a setting or parameter to an API or other interface of a device driver, provide a setting or parameter as part of a storage request for the operation, or the like. The control module 202, in one embodiment, may write a reduced loop count for an erase or program operation (e.g., a sub-operation of an erase or program procedure) to a register of a non-volatile memory element 123 to give the erase or program operation a predetermined duration (e.g., one pulse, two pulses) and/or divide or breakup an erase or program procedure into multiple sub-operations.

As described in greater detail below with regard to the adjustment module 302, the control module 202 and/or the adjustment module 302 may modify, adjust, and/or set a configuration parameter (e.g., an erase parameter, a program parameter, or the like) for an operation of a procedure. A configuration parameter, as used herein, may comprise a parameter for a storage operation of a procedure for a set of storage cells that is modifiable by way of an interface. Configuration parameters may relate to writing to or programming storage cells, reading from storage cells, erasing storage cells, managing storage cells, and/or to another operation or procedure for storage cells. The control module 202 and/or the adjustment module 302 may determine a configuration parameter as an absolute data value, as an offset or adjustment to a data value, or as another parameter with which the execution module 204 may configure a storage operation or procedure for a set of storage cells.

Various embodiments of a configuration parameter for erasing storage cells (e.g., an erase parameter) may include a voltage level step size or magnitude for an incremental step pulse erase operation, a maximum number of iterations or pulses for an incremental step pulse erase operation (e.g., a loop count), an erase verify threshold voltage level for an erase operation, an initial bias or start erase voltage level for an incremental step pulse erase operation, a erase pulse duration for an incremental step pulse erase operation, a maximum erase voltage, or the like.

A configuration parameter for writing/programming storage cells (e.g., a program parameter) may include a voltage level step size or magnitude for an incremental step pulse programming operation, a maximum number of iterations or pulses for an incremental step pulse programming operation (e.g., a loop count), a program verify threshold voltage level for a program operation, an initial bias or start program voltage level for an incremental step pulse programming operation, a program pulse duration for an incremental step pulse programming operation, a maximum program voltage or the like.

One embodiment of a configuration parameter for reading from storage cells is a read threshold such as a read voltage threshold, a resistivity threshold, or the like. Other embodiments of configuration parameters for reading from storage cells may include whether to perform a read retry in response to an error, whether to adjust a read threshold or other configuration parameter prior to a read retry, or the like. For example, the control module 202, the adjustment module 302, or the like may determine a number of read retries to perform, a maximum number of read retries, configuration parameters for each read retry, or the like.

In one embodiment, the execution module 204 is configured to execute and/or perform multiple segments, portions, divisions, or operations from the control module 202 for a single erase or program procedure on one or more non-volatile memory elements 123. The execution module 204, in certain embodiments, may execute or perform each segment, portion, division, and/or operation independently, with a separate command (e.g., separate erase command, separate program command, or the like).

The execution module 204, in one embodiment, may execute or perform a segment, portion, division, and/or operation for multiple non-volatile memory elements 123 in parallel (e.g., where multiple dies, die-planes, chips, packages, banks, channels, integrated circuits, pages, erase blocks, or the like are accessed in parallel). For example, the execution module 204 may execute or perform an erase operation for multiple physical erase blocks which are logically grouped together to form a logical erase block, may execute or perform a program or write operation for multiple physical pages which are logically grouped together to form a logical page, or the like.

In certain embodiments, the execution module 204 may iteratively and/or repeatedly execute different segments, portions, divisions, and/or operations for an erase and/or program procedure until one is verified as successful, does not fail, or the like. As described above, in response to the execution module 204 performing and/or executing a segment, portion, division, or operation on a non-volatile memory element 123, the non-volatile memory element 123, the non-volatile memory media controller 126, or the like may verify whether or not the operation completed successfully, using a verify threshold voltage or the like (e.g., verify that an erase operation has placed a stored voltage level below an erase verify threshold voltage, verify that a program operation has placed a stored voltage level above a program verify threshold voltage, or the like). In certain embodiments, an operation may be verified as completing successfully in response to at least a threshold amount of the associated storage cells satisfying the verify threshold voltage (e.g., all storage cells, all storage cells but five, or the like).

The execution module 204, in certain embodiments, operates in a feedback loop configuration (e.g., as a closed loop controller), repeating a storage operation (e.g., an erase and/or program operation), executing or performing a segment, portion, division, and/or operation, or the like iteratively until success is verified. For example, verification (e.g., success or failure) of an operation or portion/segment of a procedure may comprise feedback for the execution module 204, based upon which the execution module 204 may repeat and/or adjust execution of the operation. The execution module 204, in one embodiment, may repeat the same segment, portion, division, and/or operation, with the same settings and/or configuration parameters, until success is verified (e.g., the same loop count and/or other configuration parameter).

The execution module 204, in one embodiment, may execute or perform a segment, portion, division, or operation using one or more adjustments from the adjustment module 302, described below. In a further embodiment, the execution module 204 cooperates with the adjustment module 302 described below to adjust one or more configuration parameters for each successively executed or performed segment, portion, division, storage operation, or the like. In one embodiment, the execution module 204 and/or the adjustment module 302 may make the same, predetermined adjustment for each successive execution (e.g., incrementing a loop count, incrementing a voltage level, or the like).

In a further embodiment, the execution module 204 may dynamically determine an adjustment for each successive execution based on feedback. As used herein, feedback may comprise one or more of information, statistics, metrics, flags, indicators, parameters, or the like associated with execution of a storage operation, procedure, or portion thereof. In one embodiment, the execution module 204 may use a count of operations, portions, and/or segments that the execution module 204 has already executed or performed for a procedure as feedback (e.g., a number of iterations or repetitions). In a further embodiment, the execution module 204 may use the parameters or settings used for execution of one or more previous operations, portions, and/or segments as feedback for a subsequent execution. The execution module 204 may select which parameter to adjust, a magnitude or direction of an adjustment, or the like based on the feedback. For example, in one embodiment, the execution module 204 may increase a loop count for each iteration up to a predefined number of iterations, increase a starting voltage for each iteration after a predefined number of iterations, or may adjust another parameter for an operation of a procedure based on feedback.

The execution module 204, in certain embodiments, may track or maintain feedback, state information, or other metadata for multiple regions of the non-volatile memory media 122, such as non-volatile memory elements 123, logical or physical erase block, logical or physical page, or the like, so that the execution module 204 may perform erase and/or program operations or procedures on multiple storage regions at a time, without losing track of the state or feedback for the various operations. As described above, the control module 202 may track or maintain feedback, state information, or other metadata for a procedure which may comprise multiple operations.

The execution module 204, the non-volatile memory media controller 126, the SML 130, the non-volatile memory controller 124, or the like, in certain embodiments, may determine when an erase block, a non-volatile memory element 123, or another storage region is un-usable, should be retired from use, or the like, based on feedback or other metadata the execution module 204 maintains from performing operations on the non-volatile memory elements 123.

For example, instead of relying on an alert or error from the non-volatile memory media 122 itself to determine when to retire an erase block or other set of storage cells, metadata or feedback from the execution module 204 may be used, such as a threshold number of operations being executed without being verified as successful, or the like. In one embodiment, relying on feedback or metadata from the execution module 204 to determine retirement of storage cells may provide more accurate detection of failed or failing media, may allow for longer use of the storage cells, or the like.

As described below, the storage request module 206 may execute or perform one or more other storage operations, in response to a storage request from a client 116 or the like, in between the execution module 204 executing or performing at least a pair of operations, segments, and/or portions of a storage procedure. For example, the execution module 204 may perform a one or more first portions, segments, or operations for an erase and/or program procedure on a non-volatile memory element 123, then the execution module 204 may allow the storage request module 206 to perform one or more other storage operations on the non-volatile memory element (e.g., a read operation, a write/program operation, or the like), and then the execution module 204 may perform one or more additional portions, segments, or operations for the erase and/or program procedure on the non-volatile memory element 123, until one of the portions, segments, or operations completes successfully, without failure, or the like.

In one embodiment, the execution module 204 may function as a background task, erasing erase blocks in conjunction with a groomer, as described above, or another storage capacity recovery process. In a further embodiment, the execution module 204 may perform a storage procedure (e.g., a plurality of operations, segments, and/or portions of the storage procedure) in response to a storage request (e.g., performing a program procedure in response to a write request, an erase procedure in response to a trim request, or the like).

In one embodiment, the storage request module 206 is configured to perform or execute one or more storage operations, such as a read operation, a write/program operation, or the like. The storage request module 206 may execute one or more storage operations between the execution module 204 performing and/or executing at least a pair of operations, segments, and/or portions of a different storage procedure. For example, the storage request module 206 may perform or execute a storage operation to satisfy a storage request from a storage client 116 or the like for one or more storage elements 123 upon which the execution module 204 is executing the other storage procedure. A storage request may be directed to and/or addressed to one or more storage elements 123 upon which the execution module 204 is currently performing an erase and/or program procedure, or the like. The storage request module 206, in certain embodiments, may execute storage operations that are shorter than storage procedures that the execution module 204 executes. For example, in one embodiment, the storage request module 206 may perform read operations and/or program operations, the execution module 204 may perform erase operations and/or program operations, or the like.

Because the storage request module 206 may perform storage operations (e.g., to satisfy storage requests from storage clients 116) between the execution module 204 executing at least a pair of operations, segments, and/or portions of storage procedures which the control module 202 has divided, the storage procedures of the control module 202 and the execution module 204 may have minimal impact on the latency of storage operations that the storage request module 206 performs.

Figure 3:
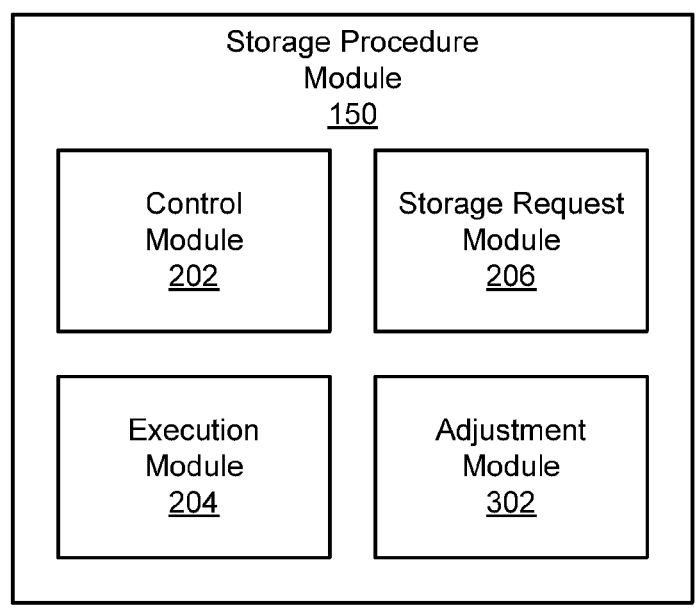
FIG. 3 is a schematic block diagram illustrating another embodiment of a storage procedure module.

FIG. 3 depicts another embodiment of the storage procedure module 150. The storage procedure module 150 of FIG. 3, in certain embodiments, may be substantially similar to the storage procedure module 150 described above with regard to FIG. 1 and/or FIG. 2. In the depicted embodiment, the storage procedure module 150 includes the control module 202, the execution module 204, the storage request module 206, and an adjustment module 302.

In one embodiment, the adjustment module 302 may modify, adjust, and/or set a configuration parameter (e.g., an erase parameter, a program parameter, or the like) for a storage operation of a procedure, changing the configuration parameter from a default value or the like. A configuration parameter, as described above, may comprise a parameter for a storage operation for a set of storage cells that is modifiable by way of an interface. Configuration parameters may relate to writing to or programming storage cells, reading from storage cells, erasing storage cells, managing storage cells, and/or to another operation or procedure for storage cells. The adjustment module 302 may determine a configuration parameter as an absolute data value, as an offset or adjustment to a data value, or as another parameter with which the adjustment module 302 may configure a storage operation or procedure for a set of storage cells.

As described above, embodiments of a configuration parameter for erasing storage cells (e.g., an erase parameter) may include a voltage level step size or magnitude for an incremental step pulse erase operation, a maximum number of iterations or pulses for an incremental step pulse erase operation (e.g., a loop count), an erase verify threshold voltage level for an erase operation, an initial bias or start erase voltage level for an incremental step pulse erase operation, a erase pulse duration for an incremental step pulse erase operation, a maximum erase voltage, or the like.

A configuration parameter for writing/programming storage cells (e.g., a program parameter), in certain embodiments, may include a voltage level step size or magnitude for an incremental step pulse programming operation, a maximum number of iterations or pulses for an incremental step pulse programming operation (e.g., a loop count), a program verify threshold voltage level for a program operation, an initial bias or start program voltage level for an incremental step pulse programming operation, a program pulse duration for an incremental step pulse programming operation, a maximum program voltage or the like.

One embodiment of a configuration parameter for reading from storage cells is a read threshold such as a read voltage threshold, a resistivity threshold, or the like. Other embodiments of configuration parameters for reading from storage cells may include whether to perform a read retry in response to an error, whether to adjust a read threshold or other configuration parameter prior to a read retry, or the like. For example, the control module 202, the adjustment module 302, or the like may determine a number of read retries to perform, a maximum number of read retries, configuration parameters for each read retry, or the like.

As described above, the execution module 204, in certain embodiments, may operate in a feedback loop configuration (e.g., as a closed loop controller). The adjustment module 302 may determine and/or make an adjustment for each iteratively executed or performed segment, portion, division, or operation, based on the feedback described above, or the like. In one embodiment, the adjustment module 302 may make the same, predetermined adjustment for each successive execution (e.g., incrementing a loop count, incrementing a voltage level, or the like).

In another embodiment, the adjustment module 302 may dynamically determine an adjustment for each successive execution based on feedback. As described above, feedback may comprise one or more of information, statistics, metrics, flags, indicators, parameters, or the like associated with execution of a storage operation, procedure, or portion thereof. In one embodiment, the adjustment module 302 may use a count of portions or segments that the execution module 204 has already executed or performed for a procedure or operation as feedback (e.g., a number of iterations or repetitions) for determining an adjustment. In a further embodiment, the adjustment module 302 may use the parameters or settings used for execution of one or more previous portions or segments as feedback for an adjustment to a subsequent execution. The adjustment module 302 may select which parameter to adjust, a magnitude or direction of an adjustment, or the like based on the feedback. For example, in one embodiment, the adjustment module 302 may increase a loop count for each iteration up to a predefined number of iterations, increase a starting voltage for each iteration after a predefined number of iterations, or may adjust another parameter for an operation based on feedback.

In one embodiment, the adjustment module 302 may set a loop count (e.g., a maximum number of pulses) for an erase operation and/or a program operations for a memory element 123 (e.g., an erase block) to less than a default loop count for the non-volatile memory device 120 comprising the memory element 123. In a further embodiment, the adjustment module 302 may increase the initial or start voltage (e.g., of a pulse, of a ramp-up voltage, or the like) for successively performed erase operations of an erase procedure, program operations of a program procedure, or the like. In one embodiment, the adjustment module 302 may increase a number of erase pulses, program pulses, or the like for successively performed segments, portions, or operations for a procedure. The adjustment module 302, in cooperation with the execution module 204, in certain embodiments, may adjust one or more configuration parameters for successively performed segments, portions, divisions, or operations until one is verified as successful, until a predefined retry threshold is satisfied, or the like.

For example, the adjustment module 302 may initially set a loop count for an erase operation to one. A loop count of one may cause some cell erase benefits (e.g., move a stored voltage toward an erased state) but the associated erase block, in certain embodiments, may report that the state of the cells are such that the erase procedure is not yet successful. After this one erase loop, the storage request module 206 may determine whether or not to perform any intervening reads or writes that are queued for this plane, die, bank, or other non-volatile memory element 123 of the erase procedure. If there are none, then the adjustment module 302 may increase or otherwise adjust the loop count by one or by another predefined amount and the execution module 204 may execute the erase operation for a second iteration. The adjustment module 302 may continue a cycle of increased erase loop counts for successive calls for an erase operation until the execution module 204 successfully finishes an erase operation (e.g., the operation is verified as successful) or the execution module 204 reaches a maximum number of repetitions or cycles (e.g., five cycles, six cycles, or the like). As described above, T-erase may be well defined (e.g., known, fixed) and the control module 202 may provide breaks between iterations for the storage request module 206 to conduct other operations.

In another embodiment, instead of or in addition to incrementing or increasing a loop count, the adjustment module 302 may increase an initial or start voltage, an angle or rate at which a voltage increases (e.g., of a ramp-up voltage), or the like for each iteration. For example, the adjustment module 302 may progressively increase the erase start voltage for each iteration from its default setting by either a fixed or a varying amount (e.g., by 0.5 volts or the like).

As described above, the adjustment module 302 may modify a configuration parameter by way of an interface. In one embodiment, the adjustment module 302 may modify or set a configuration parameter by storing a value for the parameter in a control register or other memory buffer of a non-volatile memory element 123. The interface may comprise a publicly known interface or a proprietary interface and may include use of particular command instructions and/or use of particular parameters, register settings, driver settings, controller settings, a particular set of command instruction sequences, or other differences from regular commands (e.g., general purpose commands) or settings used to interface with or manage a set of storage cells.

In certain embodiments, the non-volatile memory device 120, each non-volatile memory element 123, or the like, may include multiple control registers or other memory buffers to store erase parameters. The adjustment module 302 may determine a parameter, an adjustment, or the like by entering feedback or other metadata (e.g., a number of iterations already performed) into an equation, into a mathematical model, into a lookup table (LUT), into a matrix, or the like; by performing a predefined transform or operation; or by otherwise referencing and/or manipulating feedback or other metadata to determine a configuration parameter.

A configuration parameter equation, mathematical model, LUT, matrix, or the like may be based on empirical data, such as test data, historical data, and the like. A design engineer or the like, in one embodiment, may test sets of storage cells using various configuration parameters for storage operations and may determine optimal configuration parameters for an erase operation, a program operation, or the like. In other embodiments, the adjustment module 302 may dynamically determine a configuration parameter; an equation, mathematical model, LUT, matrix, transform, or the like to define a configuration parameter; an adjustment to a configuration parameter; or the like during operation of the non-volatile memory device 120. For example, the adjustment module 302 may determine configuration parameters for various storage operations, portions, and/or segments of a storage procedure initially based on trial and error, based on a direction of an error (e.g., from a binary one to a binary zero or vice versa), or the like and may autonomously correlate the effectiveness of the configuration parameter, based on a change in an error rate such as a raw bit error rate (RBER), an uncorrectable bit error rate (UBER), or the like, to determine an equation, mathematical model, LUT, matrix, transform, or the like for determining subsequent configuration parameters and/or adjustments.

In one embodiment, the adjustment module 302 may lower the first (or initial) voltage level for an erase and/or program operation. For example, the adjustment module 302 may lower the initial voltage from 14.8 volts to 13 volts, or lower. The adjustment module 302 may lower the initial voltage to various lower values independently for each different erase block, or the like. In one embodiment, the adjustment module 302 may adjust a voltage step size. In another embodiment, the adjustment module 302 may adjust the number of discrete pulse iterations. In a further embodiment, the adjustment module 302 may modify a pulse duration for an erase and/or program operation.

Figure 4A:
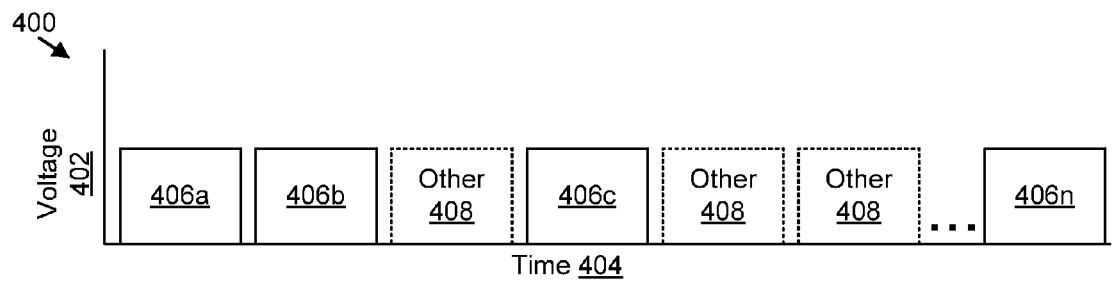
FIG. 4A is a chart illustrating one embodiment of a storage procedure for non-volatile storage cells.

FIG. 4A depicts one embodiment of a storage procedure 400 for non-volatile storage cells (e.g., an erase procedure, a program procedure, or the like). The storage procedure 400 is depicted with regard to voltage 402 over time 404. In the depicted embodiment, the control module 202 has divided or broken up the storage procedure 400 into multiple, independently executable operations 406a-n which the execution module 204 may independently execute over time 404. The storage request module 206, in the depicted embodiment, executes or performs one or more other storage operations 408 (e.g., a read operation, a program operation) in response to a storage request from a client 116 or the like, between execution of at least a pair of the operations 406a-n.

Figure 4B:
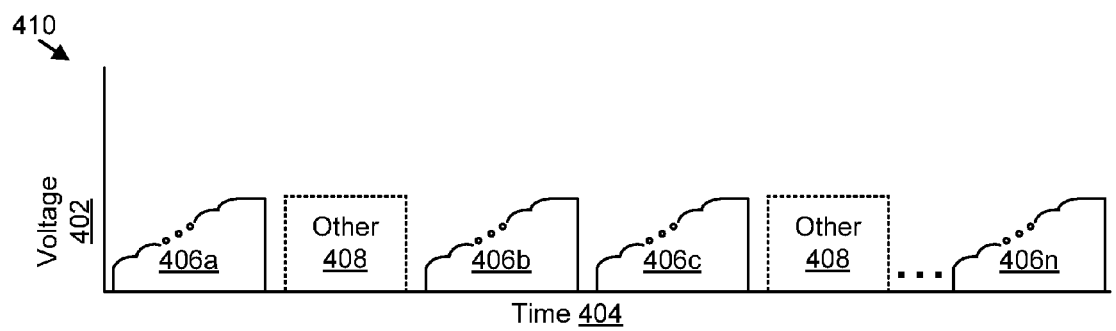
FIG. 4B is a chart illustrating another embodiment of a storage procedure for non-volatile storage cells.

FIG. 4B depicts one embodiment of a storage procedure 410 for non-volatile storage cells. In the embodiment depicted in FIG. 4B, each operation 406a-n of the storage procedure 410 comprises its own ramp-up voltage, from a first, lower voltage level to a second, higher voltage level. The ramp-up voltage, in certain embodiments, may be adjustable or customizable by the adjustment module 302. For example, in one embodiment, the adjustment module 302 may set or adjust a slope of a ramp-up voltage; a duration of a ramp-up; a number, slope, or duration of individual steps within a ramp-up; or the like. In FIG. 4B, the execution module 204 repeats a single, initial ramp-up pulse for each operation 406 (e.g., with a loop count of one), without the adjustment module 302 adjusting or changing configuration parameters for the operations 406a-n, until the execution module 204 verifies an operation 405a-n as successfully completing.

Figure 4C:
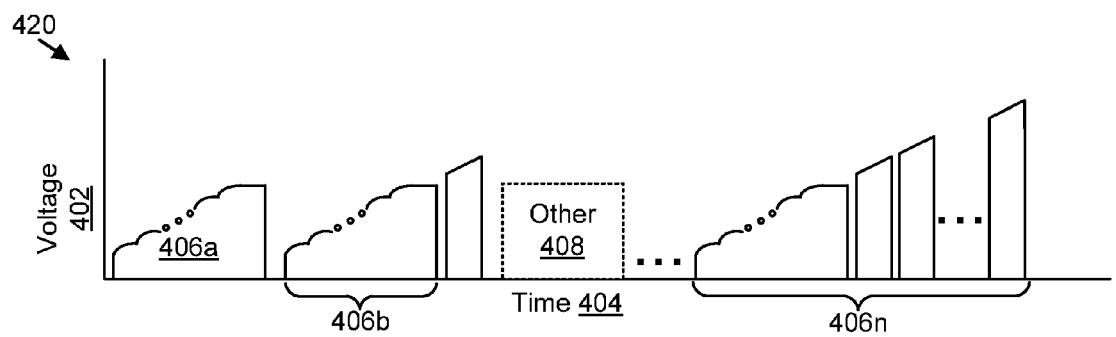
FIG. 4C is a chart illustrating a further embodiment of a storage procedure for non-volatile storage cells.

FIG. 4C depicts one embodiment of a storage procedure 420 for non-volatile storage cells. In the depicted embodiment, the adjustment module 302 increments or increases a loop count by one for each successively executed operation 406a-n. As depicted, the first operation 406a comprises a single pulse (e.g., a loop count equals one), the second operation 406b comprises two pulses (e.g., a loop count equals two), and so on until the Nth operation 406n comprises N pulses (e.g., a loop count equals N) and the Nth operation 406n is verified as completing successful (e.g., the associated storage cells are successfully erased or programmed).

Figure 4D:
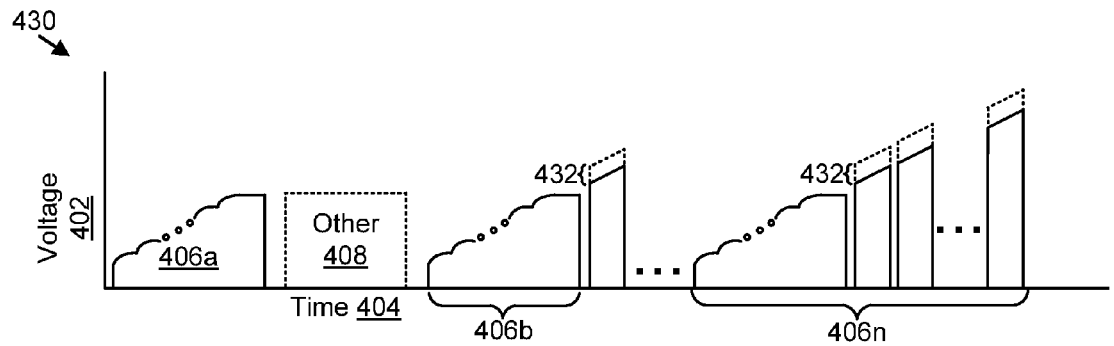
FIG. 4D is a chart illustrating an additional embodiment of a storage procedure for non-volatile storage cells.

FIG. 4D depicts one embodiment of a storage procedure 430 for non-volatile storage cells. In the depicted embodiment, the adjustment module 302 increases a loop count for each successively executed operation 406a-n and increases a start voltage for pulses after the initial ramp-up voltage by a predefined amount 432. The predefined amount 432, in the depicted embodiment, is constant. In other embodiments, the predefined amount 432 may be variable, may increase for each successively executed operation 406a-n, or the like.

Figure 4E:
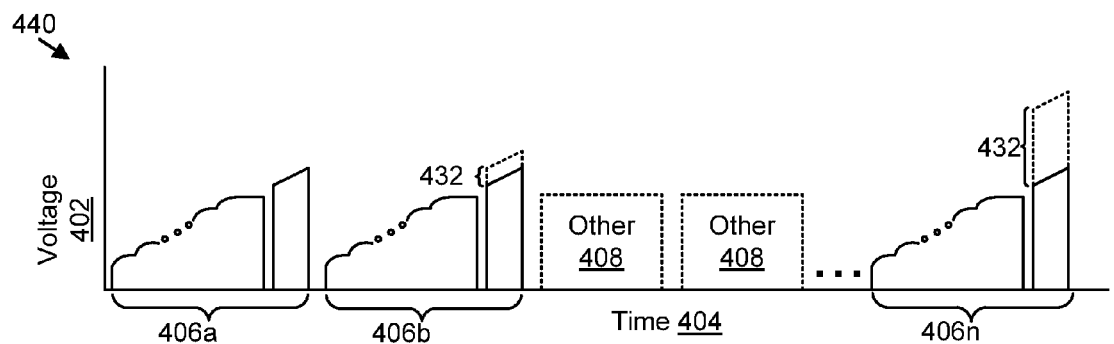
FIG. 4E is a chart illustrating another embodiment of a storage procedure for non-volatile storage cells.

FIG. 4E depicts one embodiment of a storage procedure 440 for non-volatile storage cells. In the depicted embodiment, the loop count for the operations 406a-n is constant (e.g., the loop count equals two) and the adjustment module 302 increases the start voltage for pulses after the initial ramp-up voltage (e.g., the second pulse) by an increasing amount 432 for each successively executed operation 406a-n.

Figure 4F:
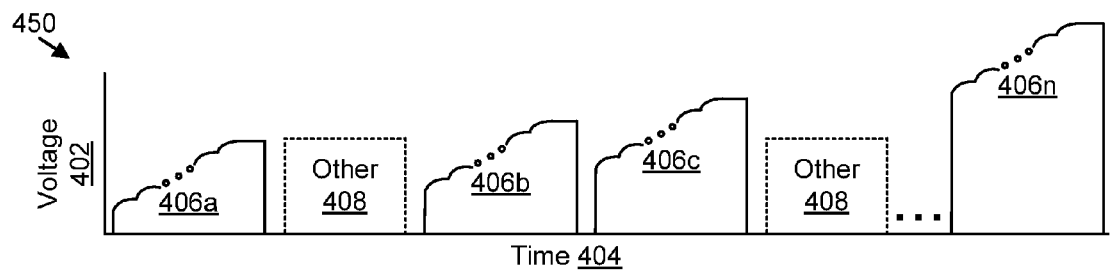
FIG. 4F is a chart illustrating a further embodiment of a storage procedure for non-volatile storage cells.

FIG. 4F depicts one embodiment of a storage procedure 450 for non-volatile storage cells. In the depicted embodiment, the loop count for the operations 406a-n is constant (e.g., the loop count equals one) and the adjustment module 302 increases the start voltage for the initial ramp-up pulse for each successively executed operation 406a-n. While FIGS. 4A-4F depict various example embodiments of adjustments which the adjustment module 302 may make for one or more independently executable operations 406a-n of an erase procedure 400, 410, 420, 430, 440, 450, in other embodiments, the adjustment module 302 may make no adjustments, may make a different adjustment, may make a different combination of adjustments, or the like.

Figure 5:
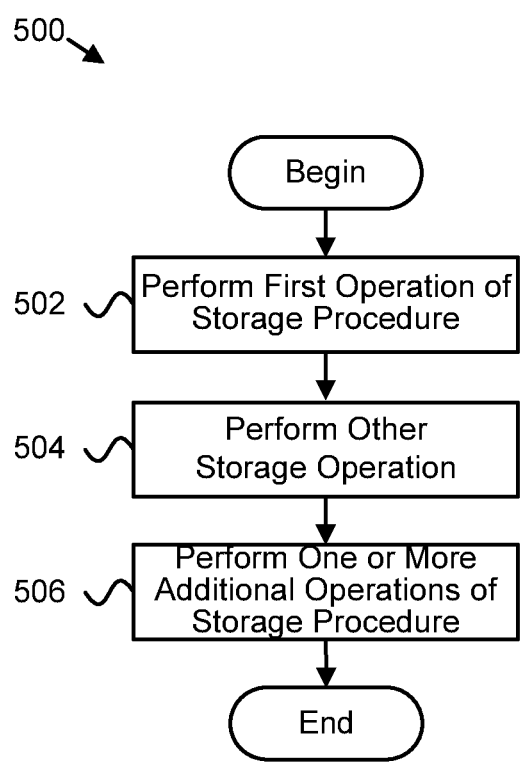
FIG. 5 is a schematic flow chart diagram illustrating one embodiment of a method for a storage procedure.

FIG. 5 depicts one embodiment of a method 500 for a storage procedure. The method 500 begins and the execution module 204 performs 502 a first storage operation of a storage procedure for a set of non-volatile memory cells of a non-volatile memory element 123, such as an erase operation of an erase procedure, a program operation of an erase procedure, or the like. The storage request module 206 performs 504 another, different storage operation on the memory element 123 in response to the execution module 204 performing 502 the first storage operation. The execution module 204 performs 506 one or more additional storage operations of the storage procedure for the set of memory cells in response to the storage request module 206 performing 504 the other, different storage operation and the method 500 ends.

Figure 6:
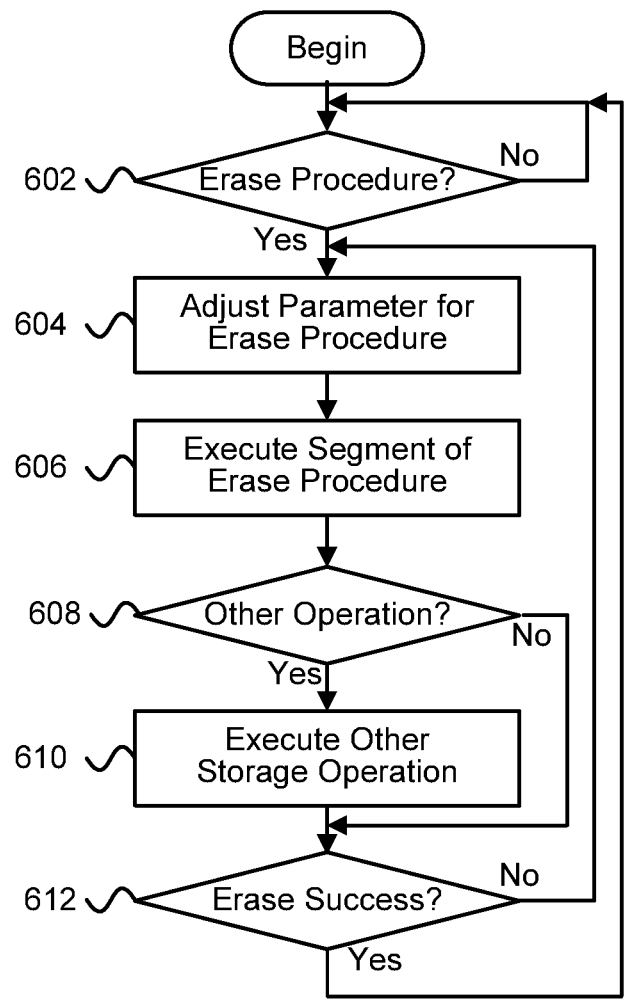
FIG. 6 is a schematic flow chart diagram illustrating another embodiment of a method for a storage procedure.

FIG. 6 depicts one embodiment of a method 600 for a storage procedure. The method 600 begins and the control module 202 determines 602 whether there's a queued or pending erase procedure to perform for a non-volatile memory element 123. If the control module 202 determines 602 to perform an erase procedure, the adjustment module 302 adjusts 604 one or more erase parameters for the erase procedure (e.g., for an operation, portion, and/or segment of the erase procedure). The execution module 204 executes 604 an operation, segment, and/or portion of the erase procedure with the adjusted 604 one or more erase parameters for a set of storage cells of the non-volatile memory element 123.

The storage request module 206 determines 608 whether one or more other storage operations are queued or pending for the non-volatile memory element 123. If the storage request module 206 determines 608 that one or more other storage operations are queued or pending, the storage request module 206 executes 610 the one or more other storage operations on a set of storage cells of the non-volatile memory element 123.

The execute module 204 determines 612 whether the executed 606 operation, segment, and/or portion of the erase procedure has been validated as successful. If the execute module 204 determines 612 that the executed 606 operation, segment, and/or portion of the erase procedure did not successfully complete, the adjustment module 604 may adjust one or more erase parameters and the execution module 204 may execute 606 one or more additional operations, segments, and/or portions of the erase procedure, until the erase procedure is verified 612 as successful or the like. Once the execution module 204 determines 612 that an executed 606 operation, segment, and/or portion has been validated as successful, the control module 202 may continue to monitor 602 for a subsequent erase procedure and the method 602 may continue.

A means for breaking up a storage procedure for a non-volatile storage element 123 into multiple portions configured to cause less wear on the non-volatile storage element 123 than a default storage procedure, in various embodiments, may include a control module 202, an execution module 204, a storage procedure module 150, a non-volatile memory controller 124, a non-volatile memory media controller 126, an SML 130, other logic hardware, and/or other executable code stored on a computer readable storage medium. Other embodiments may include similar or equivalent means for breaking up a storage procedure for a non-volatile storage element 123 into multiple portions.

A means for independently executing multiple portions of an erase procedure for an erase block of a non-volatile storage element 123, in various embodiments, may include a control module 202, an execution module 204, a storage procedure module 150, a non-volatile memory controller 124, a non-volatile memory media controller 126, an SML 130, other logic hardware, and/or other executable code stored on a computer readable storage medium. Other embodiments may include similar or equivalent means for independently executing multiple portions of an erase procedure for an erase block of a non-volatile storage element 123.

A means for performing one or more of a read operation and a write operation on a non-volatile storage element 123 between at least a pair of portions of a storage procedure, in various embodiments, may include a storage request module 206, a storage procedure module 150, a non-volatile memory controller 124, a non-volatile memory media controller 126, an SML 130, a non-volatile memory device 120, a non-volatile memory media element 123, non-volatile memory media 122, other logic hardware, and/or other executable code stored on a computer readable storage medium. Other embodiments may include similar or equivalent means for performing one or more of a read operation and a write operation on a non-volatile storage element 123 between at least a pair of portions of a storage procedure.

A means for increasing a loop count for successively performed portions of a storage procedure until a portion is verified as successful, in various embodiments, may include an execution module 204, a storage procedure module 150, a non-volatile memory controller 124, a non-volatile memory media controller 126, an SML 130, a non-volatile memory device 120, non-volatile memory media 122, a non-volatile memory element 123, other logic hardware, and/or other executable code stored on a computer readable storage medium. Other embodiments may include similar or equivalent means for increasing a loop count for successively performed portions of a storage procedure until a portion is verified as successful.

A means for increasing a start voltage for successively performed portions of a storage procedure until a portion is verified as successful, for increasing a number of pulses for successively performed portions of a storage procedure until a portion is verified as successful, or the like, in various embodiments, may include an adjustment module 302, a control module 202, a storage procedure module 150, a non-volatile memory controller 124, a non-volatile memory media controller 126, an SML 130, a non-volatile memory device 120, non-volatile memory media 122, a non-volatile memory element 123, other logic hardware, and/or other executable code stored on a computer readable storage medium. Other embodiments may include similar or equivalent means for increasing a start voltage for successively performed portions of a storage procedure until a portion is verified as successful, for increasing a number of pulses for successively performed portions of a storage procedure until a portion is verified as successful, or the like.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    adjusting one or more parameters for an erase operation for a set of non-volatile memory cells of a non-volatile memory element, by reducing a number of pulses for the erase operation from a default number of pulses such that the erase operation has a predetermined duration;
    executing the adjusted erase operation for the set of memory cells for the predetermined duration; and
    iteratively executing one or more additional adjusted, separate erase operations for the set of memory cells with predetermined durations until an erase verify voltage threshold is satisfied.

2. The method of claim 1, further comprising executing a storage operation on the memory element between executing two of the adjusted erase operations.

3. The method of claim 1, wherein the adjusted erase operation and the one or more additional adjusted erase operations comprise sub-operations of the same erase procedure for the set of non-volatile memory cells.

4. The method of claim 1, wherein the adjusted erase operation and the one or more additional adjusted erase operations are executed without executing a suspend command for the non-volatile memory element.

5. The method of claim 1, wherein the adjusted erase operation and the one or more additional adjusted erase operations are independently executable with separate erase commands.

6. The method of claim 1, wherein a predefined duration for at least one of the adjusted erase operation and the one or more additional adjusted erase operations is shorter than a default time for an erase operation.

7. The method of claim 1, wherein multiple erase operations of the adjusted erase operation and the one or more additional adjusted erase operations each comprise a ramp-up voltage increasing from a first voltage level to a second voltage level.

8. The method of claim 7, further comprising increasing at least the first voltage for the ramp-up voltage for successively executed adjusted erase operations.

9. The method of claim 1, further comprising increasing a number of erase pulses for successively executed erase operations of the adjusted erase operation and the one or more additional adjusted erase operations.

10. The method of claim 1, further comprising increasing a start voltage for successively executed erase operations of the adjusted erase operation and the one or more additional adjusted erase operations.

11. An apparatus comprising:
    a control module configured to adjust one or more parameters for an erase operation for a set of non-volatile memory cells of a non-volatile memory element such that the erase operation has a predetermined duration; and
    an execution module configured to
        execute the adjusted erase operation for the set of memory cells for the predetermined duration, and
        iteratively execute one or more additional adjusted, separate erase operations for the set of memory cells with predetermined durations until an erase verify voltage threshold is satisfied, in response to a verify operation performed for each of the additional adjusted, separate erase operations, wherein multiple erase operations of the adjusted erase operation and the one or more additional adjusted erase operations each comprise a ramp-up voltage increasing from a first erase voltage level to a second erase voltage level.

12. The apparatus of claim 11, further comprising a storage request module configured to execute a storage operation on the memory element between executing two of the adjusted erase operations.

13. The apparatus of claim 11, further comprising an adjustment module configured to adjust one or more parameters for the adjusted erase operations from one or more default values for the erase operation.

14. The apparatus of claim 13, wherein the one or more parameters comprise one or more of a loop count, a start erase voltage level, an erase voltage level step size, an erase verify voltage level, a maximum erase voltage, and an erase pulse duration.

15. The apparatus of claim 11, wherein the adjusted erase operation and the one or more additional adjusted erase operations are executed without executing a suspend command for the non-volatile memory element.

16. A computer program product comprising a computer readable storage medium storing computer usable program code executable to perform operations, the operations comprising:

adjusting one or more parameters for an erase operation for a set of non-volatile memory cells of a non-volatile memory element, by reducing a number of pulses for the erase operation from a default number of pulses such that the erase operation has a predetermined duration;

executing the adjusted erase operation for the set of memory cells for the predetermined duration; and iteratively executing one or more additional adjusted, separate erase operations for the set of memory cells with predetermined durations until an erase verify voltage threshold is satisfied, wherein multiple erase operations of the adjusted erase operation and the one or more additional adjusted erase operations each comprise a ramp-up voltage increasing from a first erase voltage level to a second erase voltage level;

executing a storage operation on the memory element between executing two of the adjusted erase operations.

17. The computer program product of claim 16, the operations further comprising increasing a loop count for successively performed adjusted erase operations until an adjusted erase operation is verified as successful.

18. The computer program product of claim 16, the operations further comprising increasing a start voltage for successively performed adjusted erase operations until an adjusted erase operation is verified as successful.

* * * * *